US008853006B2

(12) United States Patent
Shimonishi et al.

(10) Patent No.: US 8,853,006 B2
(45) Date of Patent: Oct. 7, 2014

(54) METHOD OF MANUFACTURING SEMICONDUCTOR DEVICE AND SEMICONDUCTOR DEVICE

(71) Applicant: Toyoda Gosei Co., Ltd., Kiyosu (JP)

(72) Inventors: Syota Shimonishi, Kiyosu (JP); Hiroyuki Tajima, Kiyosu (JP); Yosuke Tsuchiya, Kiyosu (JP); Akira Sengoku, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/748,255

(22) Filed: Jan. 23, 2013

(65) Prior Publication Data
US 2013/0193580 A1 Aug. 1, 2013

(30) Foreign Application Priority Data

Jan. 30, 2012 (JP) ................. 2012-016268

(51) Int. Cl.
*H01L 21/00* (2006.01)
*H01L 23/00* (2006.01)

(52) U.S. Cl.
CPC ....... *H01L 24/80* (2013.01); *H01L 2924/01327* (2013.01); *H01L 2924/0132* (2013.01); *H01L 24/29* (2013.01); *H01L 24/13* (2013.01); *H01L 2224/49107* (2013.01); *H01L 24/32* (2013.01); *H01L 2224/45144* (2013.01); *H01L 24/08* (2013.01); *H01L 24/48* (2013.01); *H01L 2224/29339* (2013.01); *H01L 2224/29144* (2013.01); *H01L 2224/48091* (2013.01); *H01L 2924/1033* (2013.01); *H01L 2224/92247* (2013.01); *H01L 24/49* (2013.01); *H01L 2224/2908* (2013.01); *H01L 2224/48227* (2013.01); *H01L 2224/83192* (2013.01); *H01L 2924/01322* (2013.01); *H01L 2224/73265* (2013.01); *H01L 2224/83801* (2013.01); *H01L 2224/83193* (2013.01); *H01L 2224/29294* (2013.01); *H01L 2224/81193* (2013.01); *H01L 24/16* (2013.01); *H01L 24/81* (2013.01); *H01L 24/83* (2013.01); *H01L 2933/0066* (2013.01)
USPC ............ 438/121; 257/703; 257/762; 257/705

(58) Field of Classification Search
CPC ......... H01L 24/08; H01L 24/13; H01L 24/16; H01L 24/29; H01L 24/32; H01L 24/80; H01L 24/81; H01L 24/83
USPC .................................... 257/762, 779
See application file for complete search history.

(56) References Cited

U.S. PATENT DOCUMENTS 5,471,092 A    11/1995  Chan et al.
7,615,476 B2 * 11/2009  Hua .............................. 438/612

(Continued)

FOREIGN PATENT DOCUMENTS

JP        6-188551 A    7/1994
JP    2004-072048 A    3/2004

(Continued)

*Primary Examiner* — A. Sefer
(74) *Attorney, Agent, or Firm* — McGinn IP Law Group, PLLC

(57) ABSTRACT

A method of manufacturing a semiconductor device comprises a mounting step of mounting a semiconductor element having an Au—Sn layer on a substrate, wherein the mounting step includes a paste supplying step of supplying an Ag paste having an Ag nanoparticle onto the substrate, a device mounting step of mounting a side of the Au—Sn layer of the semiconductor element on the Ag paste, and a bonding step of alloying the Au—Sn layer and the Ag paste to bond the semiconductor element to the substrate, wherein the Au—Sn layer has a content rate of Au of 50 at % to 85 at %.

5 Claims, 5 Drawing Sheets

(56) References Cited

U.S. PATENT DOCUMENTS

| | | | |
|---|---|---|---|
| 2005/0194690 A1* | 9/2005 | Ishii et al. | 257/772 |
| 2005/0284918 A1* | 12/2005 | Martin et al. | 228/180.22 |
| 2006/0214274 A1 | 9/2006 | Shimokawa et al. | |
| 2007/0183920 A1* | 8/2007 | Lu et al. | 419/9 |
| 2008/0110531 A1* | 5/2008 | Schmid et al. | 148/24 |
| 2009/0065932 A1* | 3/2009 | Sane et al. | 257/737 |
| 2011/0285033 A1* | 11/2011 | Hosseini et al. | 257/779 |
| 2012/0070920 A1* | 3/2012 | Shimonishi et al. | 438/26 |
| 2012/0132952 A1* | 5/2012 | Yen | 257/99 |

FOREIGN PATENT DOCUMENTS

| | | |
|---|---|---|
| JP | 2006-269751 A | 10/2006 |
| JP | 2007-273744 A | 10/2007 |
| JP | 2009-302413 A | 12/2009 |
| JP | 2010-161252 A | 7/2010 |

* cited by examiner

METHOD OF MANUFACTURING SEMICONDUCTOR DEVICE AND SEMICONDUCTOR DEVICE

BACKGROUND OF THE INVENTION

1. Field of the invention

The present invention relates to a method of manufacturing a semiconductor device in which a semiconductor element and a substrate are bonded to each other, and the semiconductor device. In more detail, the invention relates to a method of manufacturing a semiconductor device in which a semiconductor element having an Au—Sn solder is bonded to a substrate by using an Ag paste, and the semiconductor device.

2. Description of the related art

In recent years, a solder containing Pb to be an environmentally hazardous substance is not used, that is, a so-called Pb free solder is used. Among the Pb free solders, an Au—Sn solder having a high thermal conductivity is often used (for example, see Patent Documents 1 and 2).

Since the Au—Sn solder has a poor wettability, however, a sufficiently large bonding region cannot be taken. Since a large number of oxide films are provided on a surface, moreover, a molten Au—Sn solder alloy has a poor flowability. For this reason, there is a process for applying a load to carry out bonding while performing heating and melting. However, a heating temperature is high, and furthermore, a long time is required for heating. In addition, there is a problem in that the load is to be applied for a long period of time in order to carry out the bonding.

Therefore, there is proposed a technique for solving the problems in the use of the Au—Sn solder by utilizing an additional metal such as Ag as well as the Au—Sn solder (for example, see Patent Documents 3 to 6).

Patent Document 1: JP-A-2006-269751 Publication
Patent Document 2: JP-A-2009-302413 Publication
Patent Document 3: JP-A-06-188551 Publication
Patent Document 4: JP-A-2004-072048 Publication
Patent Document 5: JP-A-2007-273744 Publication
Patent Document 6: JP-A-2010-161252 Publication When Ag is used as the additional metal, however, there is a fear that a problem of a migration might be caused. Moreover, there is also a problem in that an intermetallic compound such as an $AuSn_2$ alloy or an $AuSn_4$ alloy which has a large Sn content and tends to cause a brittle fracture is generated after an Au—Sn solder is molten, resulting in a deterioration in a bonding reliability.

SUMMARY OF THE INVENTION

The invention has been made in consideration of the problems of the prior art and has an object to provide a method of manufacturing a semiconductor device having an excellent reliability in which a semiconductor element and a substrate can be bonded to each other at a low heating temperature, and the semiconductor device.

In order to solve the problems, the invention provides a method of manufacturing a light emitting device having the following structure.

More specifically, in a method of manufacturing a semiconductor element including a mounting step of mounting a semiconductor element having an Au—Sn layer on a substrate, the mounting step has a paste supplying step of supplying an Ag paste having an Ag nanoparticle onto the substrate, a device mounting step of mounting the Au—Sn layer side of the semiconductor element on the Ag paste, and a bonding step of alloying the Au—Sn layer and the Ag paste to bond the semiconductor element to the substrate, and the Au—Sn layer has a content rate of Au of 50 at % to 85 at %.

It is preferable that the Ag paste should have a volatile solvent and a volatilizing step of volatilizing the volatile solvent should be provided after the Ag paste supplying step.

Moreover, it is preferable that the volatile solvent should be an alcohol based solvent.

Furthermore, it is preferable that the alcohol based solvent should be diol.

In order to solve the problems, moreover, the invention provides a light emitting device having the following structure.

In other words, a semiconductor device includes a semiconductor element, a substrate for mounting the semiconductor element thereon, and a bonding portion provided between the semiconductor element and the substrate for bonding the semiconductor element to the substrate, and the bonding portion includes an AuSn alloy layer and a mixed crystal layer having an $Au_5Sn$ alloy and an Ag—Au—Su solid solution in sequence from the semiconductor element side.

It is preferable that an intermetallic compound contained in a mixed crystal forming the mixed crystal layer should have a content rate of Au which is equal to or higher than 50 at %.

According to the method of manufacturing a light emitting device in accordance with the invention, the Ag paste containing the Ag nanoparticle having a high activity is used. Therefore, it is possible to bond the semiconductor element to the substrate at a low temperature. In this case, there is a fear that a migration might be caused by the Ag nanoparticle. However, the Ag—Au—Sn solid solution is formed through an invasion into an Au—Sn layer having a content rate of Au of 50 at % to 85 at %. For this reason, the migration is not caused. Moreover, the Au—Sn layer has a content rate of Au of 50 at % to 85 at %. Therefore, there is not generated an intermetallic compound such as an $AuSn_2$ alloy or an $AuSn_4$ alloy which has a large Sn content and tends to cause a brittle fracture in the bonding portion. Accordingly, it is possible to manufacture a light emitting device having a high bonding reliability between the semiconductor element and the substrate.

If the volatilizing step of volatilizing the volatile solvent containing the Ag paste is provided after the Ag paste supplying step, a void is generated in the bonding portion with difficulty. Therefore, it is possible to form a fine bonding portion, and furthermore, to enhance a bonding reliability. In addition, if the volatile solvent is an alcohol based solvent, a residue is not generated in the bonding portion. Therefore, it is possible to enhance the bonding reliability still more. In this case, if the alcohol based solvent is diol, a vaporization is carried out at an ordinary temperature with difficulty and a boiling point is low. By controlling a raised temperature to be a comparatively low temperature, consequently, it is possible to remove a solvent component. Accordingly, it is possible to cut down a manufacturing cost.

According to the light emitting device in accordance with the invention, moreover, the bonding portion of the semiconductor element and the substrate includes the AuSn alloy layer and the mixed crystal layer having the $Au_5Sn$ alloy and the Ag—Au—Sn solid solution in sequence from the semiconductor element side. Consequently, Ag is not present as a simple substance but the Ag—Au—Sn solid solution. For this reason, the migration is not caused. Accordingly, it is possible to obtain a light emitting device having a high bonding reliability.

If the intermetallic compound contained in the mixed crystal forming the mixed crystal layer has a content rate of Au which is equal to or higher than 50 at %, there is not generated an intermetallic compound such as the $AuSn_2$ alloy or the $AuSn_4$ alloy which has a large Sn content and tends to cause a brittle fracture in the bonding portion. Accordingly, it is possible to further obtain a light emitting device having a high bonding reliability.

DESCRIPTION OF THE PREFERRED EMBODIMENTS

In this specification, a mixture or a compound (an alloy) of an A element and a B element is described as "A-B", and a compound (an alloy) containing the A element and the B element at a ratio of 1 to 1 is described as an "AB alloy". Moreover, a "nanoparticle" indicates a particle having a diameter of 1 nm to 100 nm. Furthermore, "at %" indicates an atomic %.

(Bonding Mechanism of the Invention)

With reference to FIG. 1, a bonding mechanism of a semiconductor element and a substrate according to the invention will be described below.

Figure 1A:
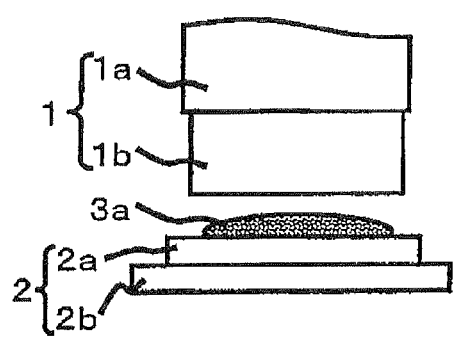
FIGS. 1(a) to 1(d) are sectional views showing a bonding mechanism according to the invention.

First of all, as shown in FIG. 1(a), there is prepared a semiconductor element 1 having an Au—Sn layer 1b provided on a mounting surface of a semiconductor element body 1a. On the other hand, there is prepared a substrate 2 having a wiring 2b provided on a surface of a substrate body 2a. Next, an Ag paste 3a to be a mixture of an Ag nanoparticle and an organic solvent is applied onto the wiring 2b. Thus, an Au—Sn layer 1b formation side of the semiconductor element 1 is opposed to the wiring 2b in a region of the substrate 2 to which the Ag paste 3a is applied.

Figure 1B:
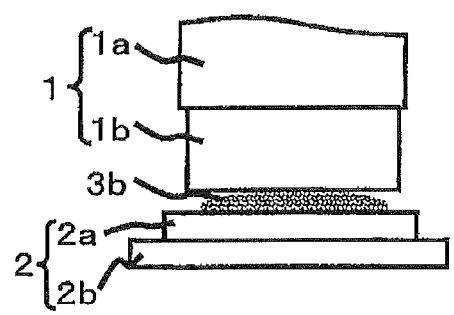

As shown in FIG. 1(b), next, a temperature is raised to volatilize and remove an organic solvent in the Ag paste 3a. In this case, it is preferable to use an organic solvent which is volatilized at a room temperature with difficulty and has a comparatively low boiling point, and does not generate a residue after the volatilization. The organic solvent includes an alcohol based solvent. Above all, it is particularly preferable to use diol such as pentanediol or hexanediol. As a raised temperature, 100° C. to 200° C. are preferred.

In this case, the Ag nanoparticle has a high activity. For this reason, the Ag nanoparticles which are adjacent to each other are started to be aggregated. Consequently, there is formed an Ag nanoparticle aggregation layer 3b in which a crystallization of a simple Ag substance progresses.

Figure 1C:
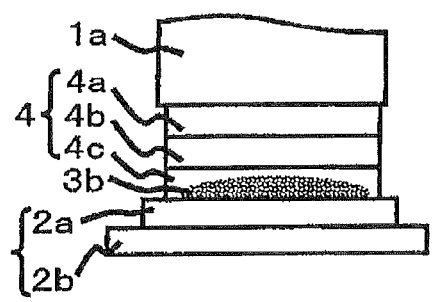
Figure 2:
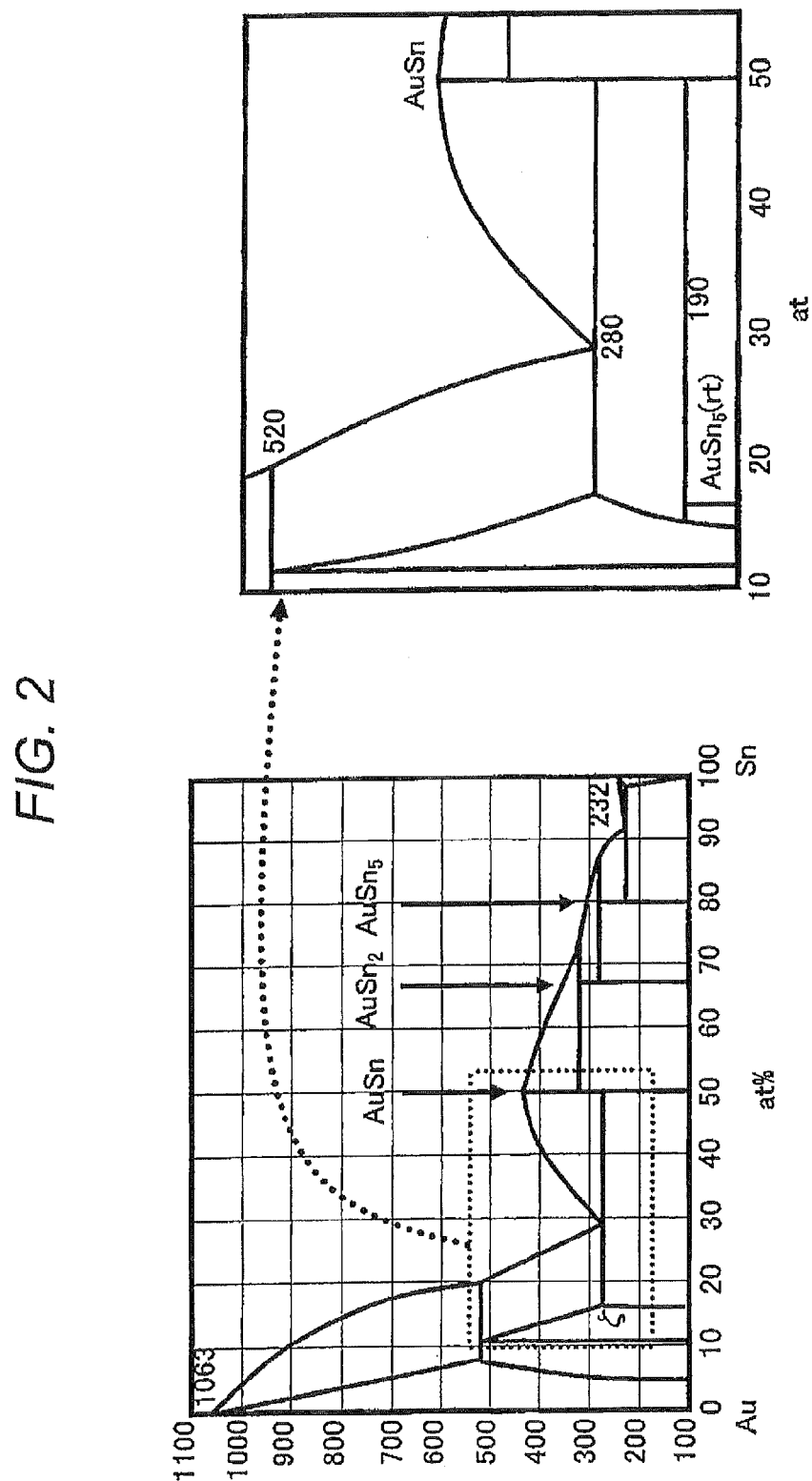
FIG. 2 is an Au—Sn based dual state diagram.

As shown in FIG. 1(c), next, the semiconductor element 1 is provided on the substrate 2 and a temperature is further raised. 280° C. to 330° C. are preferred for the raised temperature. In this case, if the Au—Sn layer is previously set to have a content rate of Au of 50 at % to 85 at %, there is formed an eutectic structure of a zeta phase to be an $Au_5Sn$ alloy at a room temperature and an AuSn alloy (an eutectic temperature: 280° C.) so that a melting point can be lowered as is apparent from an Au—Sn based alloy state diagram of FIG. 2. Moreover, there is not generated an intermetallic compound such as an $AuSn_2$ alloy or an $AuSn_4$ alloy which tends to cause a brittle fracture. When the Au—Sn alloy having the composition is used, a bonding layer 4 in a rise in the temperature is changed into an AuSn alloy layer 4a, an $Au_5Sn$ alloy layer 4b, an AuSn alloy layer 4c and an Ag nanoparticle aggregation layer 3b from the semiconductor element body 1a side.

Figure 1D:
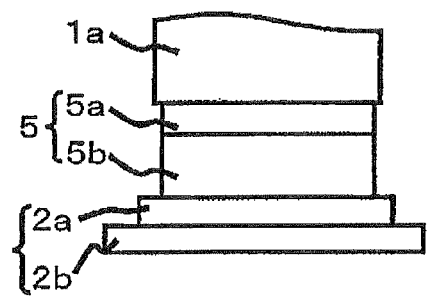
Figure 3:
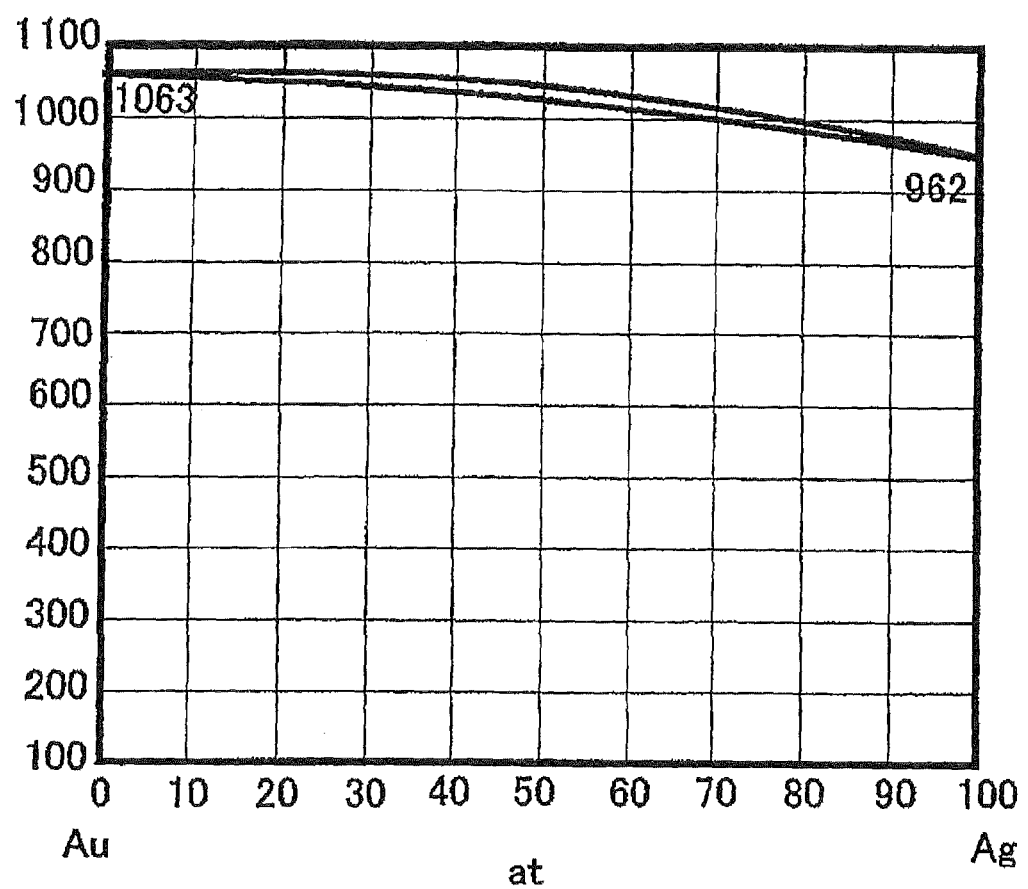
FIG. 3 is an Au—Ag based dual state diagram.

As shown in FIG. 1(d), then, the Au—Ag system is an overall percentage solution as is apparent from an Au—Ag based alloy state diagram of FIG. 3. For this reason, the Ag nanoparticle aggregation layer 3b is dissolved into the $Au_5Sn$ layer 4b and the AuSn alloy layer 4c. After a reduction in the temperature, in a bonding layer 5 at a room temperature, an AuSn alloy layer 5a and a mixed crystal layer 5b containing an $Au_5Sn$ alloy and an Ag—Au—Sn solid solution are then formed from the semiconductor element body 1a side. In this case, an intermetallic compound containing 50 at % to 85 at % of Au is sometimes generated on the mixed crystal layer 5b in addition to $Au_5Sn$.

According to the bonding mechanism in accordance with the invention, there is carried out bonding using the Ag nanoparticle having a high activity and the Au—Sn layer 1b having a content rate of Au of 50 at % to 85 at %. Therefore, the semiconductor element 1 and the substrate 2 can be bonded to each other at a comparatively low temperature. In this case, there is a fear that an Ag migration might be caused. However, Ag is not present as a simple substance but enters Au—Sn and is thus present as the Ag—Au—Sn solid solution. Therefore, the migration is suppressed. Moreover, there is not generated an intermetallic compound such as an $AuSn_2$ alloy or an $AuSn_4$ alloy which has a large content of Sn and tends to cause a brittle fracture. Therefore, it is possible to form a bonding portion having a high bonding reliability.

In order to evaluate the reliability of the bonding portion according to the invention, the inventors performed an atmospheric corrosion test (a test condition: Ta=40° C.), a migration test (a test condition: Ta=85° C./RH=85%/2 mA conduction) and a thermal shock test (a test condition: −40° C. to 100° C.). Consequently, it was confirmed that a bonding reliability is higher than a bonding reliability obtained by using only an ordinary Au—Sn solder.

Next, description will be given to embodiments in which a semiconductor element is bonded to a substrate by using the bonding mechanism according to the invention, thereby manufacturing a semiconductor device.

In the explanation of the embodiments, there is illustrated a method of manufacturing a semiconductor light emitting device using, as a semiconductor element, a gallium nitride (which will be hereinafter described as "GaN") based semiconductor light emitting device in which various bonding configurations are present.

Prior to the explanation of the embodiments, a device structure of a GaN based semiconductor light emitting device will be described with reference to FIG. 4.

Figure 4A:
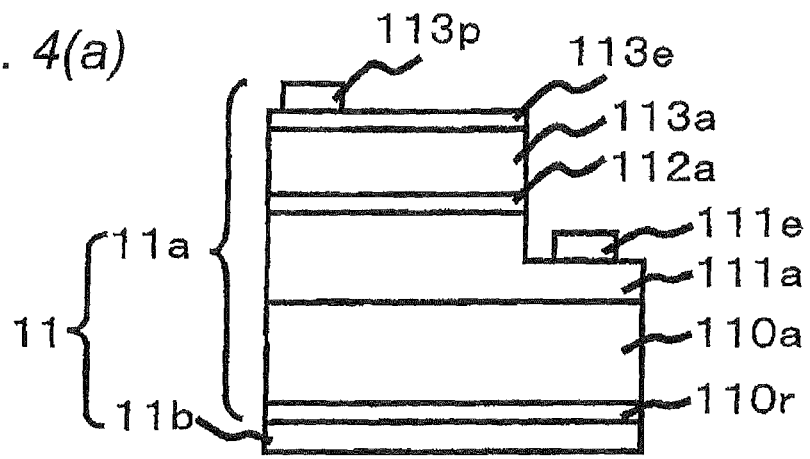
FIGS. 4(a) to 4(c) are schematic sectional views showing a structure of a gallium nitride based semiconductor light emitting device to be used in an embodiment according to the invention, FIG. 4(a) being a schematic sectional view showing a structure of a face up type semiconductor light emitting device cited in a first embodiment according to the invention, FIG. 4(b) being a schematic sectional view showing a structure of a flip chip type semiconductor light emitting device cited in a second embodiment according to the invention, and FIG. 4(c) being a schematic sectional view showing a structure of a vertical light emitting type semiconductor light emitting device cited in a third embodiment according to the invention.

FIG. 4(a) shows a sectional structure of a semiconductor light emitting device which is generally referred to as a face up type.

A semiconductor light emitting device 11 includes an n-type GaN layer 111a, a light emitting layer 112a constituted by non-dope InGaN, and a p-type GaN layer 113a which are laminated in sequence from a surface side of an insulating growth substrate 110a such as sapphire, and a portion from the p-type GaN layer 113a to a middle of the n-type GaN layer 111a is removed by etching in a partial region of the laminated body, the n-type GaN layer 111a is exposed and an n-type electrode 111e is formed in the exposed portion, a p-type transparent electrode 113e constituted by a transparent conductive oxide such as ITO, ICO or IZO is then formed on a whole surface of the p-type GaN layer 113a in a region which is not subjected to the etching, and a p-type pad electrode 113p is subsequently formed on a partial region of the p-type transparent electrode 113e. A reflecting layer 110r formed of Al and an Au—Sn layer 11b having a content rate of Au of 50 at % to 85 at % are formed on the growth substrate 110a in sequence from a back side thereof.

Figure 4B:
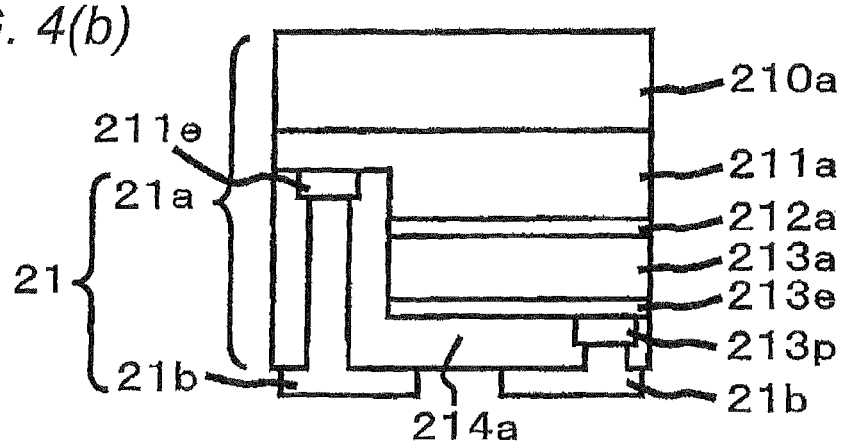

FIG. 4(b) shows a sectional structure of a semiconductor light emitting device which is generally referred to as a flip chip type.

A semiconductor light emitting device 21 includes an n-type GaN layer 211a, a light emitting layer 212a constituted by non-dope InGaN, and a p-type GaN layer 213a which are laminated in sequence from a surface side of an insulating growth substrate 210a such as sapphire, and a portion from the p-type GaN layer 213a to a middle of the n-type GaN layer 211a is removed by etching in a partial region of the laminated body, the n-type GaN layer 211a is exposed and an n-type electrode 211e is formed in the exposed portion, a p-type reflecting electrode 213e constituted by a metal having a high reflectance such as Ag, an Ag alloy or Rh is then formed on a whole surface of the p-type GaN layer 213a in a region which is not subjected to the etching, and a p-type pad electrode 213p is subsequently formed on a partial region of the p-type reflecting electrode 213e. An insulating film 214a constituted by $SiO_2$ is formed on a whole surface at the laminated body side and an opening portion is provided on the insulating film 214a in corresponding portions to the n-type electrode 211e and the p-type pad electrode 213p, and there is formed an Au—Sn layer 21b having a content rate of Au of 50 at % to 85 at % which is connected to each of the n-type electrode 211e and the p-type pad electrode 213p through the opening portion.

Figure 4C:
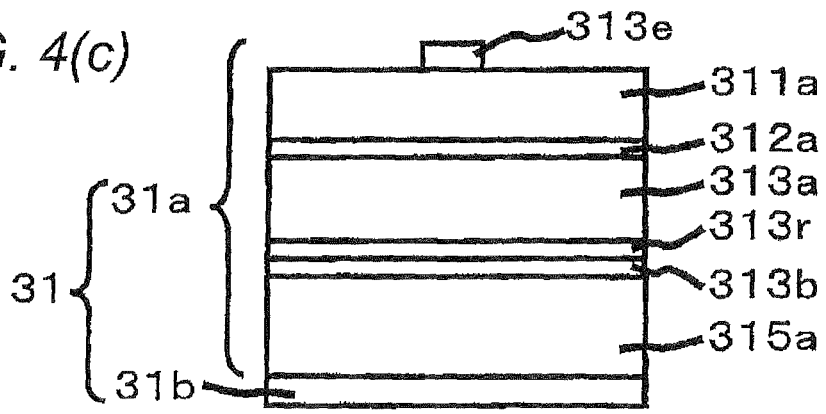

FIG. 4(c) shows a sectional structure of a semiconductor light emitting device which is generally referred to as a vertical light emitting type.

A semiconductor light emitting device 31 includes an n-type GaN layer 311a, a light emitting layer 312a constituted by non-dope InGaN, and a p-type GaN layer 313a which are laminated in sequence from a surface side of an insulating growth substrate (not shown) such as sapphire, a p-type reflecting electrode 313e constituted by a metal having a high reflectance such as Ag or an Ag alloy is then formed on a whole surface of the p-type GaN layer 313a, and a conductive support substrate 315a formed of Si or Cu is subsequently bonded through a bonding layer 313b formed of Au—Sn and a laser is thereafter irradiated on an interface between the growth substrate and the n-type GaN layer 311a from the growth substrate side so that the growth substrate is removed from the n-type GaN layer 311a. An n-type electrode 110e is formed on a part of a surface of the n-type GaN layer 311a exposed by removing the growth substrate through the irradiation of the laser, and an Au—Sn layer 31b having a content rate of Au of 50 at % to 85 at % is formed on a back face of the support substrate 315a.

FIRST EMBODIMENT

In the embodiment, a method of manufacturing a light emitting apparatus using the semiconductor light emitting device 11 of the face up type shown in FIG. 3(a) will be described with reference to FIG. 5.

Figure 5A:
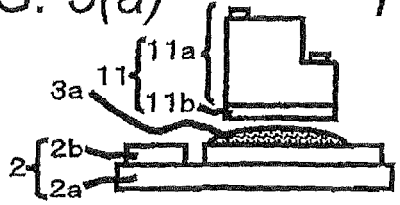
FIGS. 5(a) to 5(c) are sectional views showing a manufacturing method according to the first embodiment of the invention.

First of all, as shown in FIG. 5(a), the Ag paste 3a is applied onto a wiring 2b of a substrate 2 in which the wiring 2b is provided on a substrate body 2a, and an Au—Sn layer 11b side of the semiconductor light emitting device 11 is opposed to a region to which the Ag paste 3a is applied.

Figure 5B:
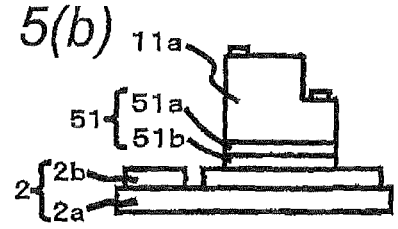
Figure 5C:
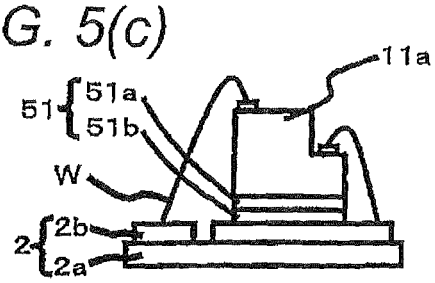

As shown in FIG. 5(b), next, a bonding layer 51 constituted by an AuSn alloy layer 51a and a mixed crystal layer 51b of an $Au_5Sn$ alloy and an Ag—Au—Sn solid solution is formed from the semiconductor light emitting device body 11b side so that the bonding layer 51 is bonded to the wiring 2b of the substrate 2 in accordance with the bonding mechanism.

Finally, each of an n-type electrode 111e in the semiconductor light emitting device body 11b and a p-type pad electrode 113 is connected to the wiring 2b through a wire W formed by a thin metallic wire such as Au so that an electrical connection of an n-type GaN layer 113a and a p-type GaN layer 113a in the semiconductor light emitting device body 11b to the substrate 2 is carried out. Consequently, a semiconductor light emitting apparatus is obtained.

SECOND EMBODIMENT

In the embodiment, a method of manufacturing a light emitting apparatus using the semiconductor light emitting device 21 of the flip chip type shown in FIG. 3(b) will be described with reference to FIG. 6.

Figure 6A:
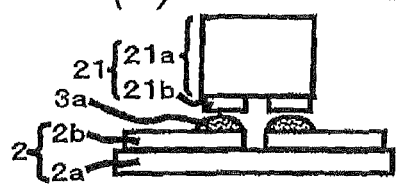
FIGS. 6(a) and 6(b) are sectional views showing a manufacturing method according to the second embodiment of the invention.

First of all, as shown in FIG. 6(a), the Ag paste 3a is applied onto a wiring 2b of a substrate 2 in which the wiring 2b is provided on a substrate body 2a, and an Au—Sn layer 21b side of the semiconductor light emitting device 21 is opposed to a region to which the Ag paste 3a is applied.

Figure 6B:
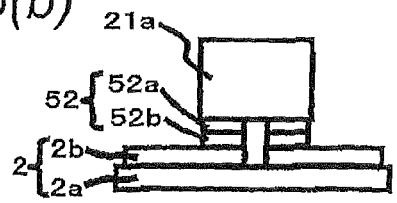

As shown in FIG. 6(b), next, a bonding layer 52 constituted by an AuSn alloy layer 52a and a mixed crystal layer 52b of an $Au_5Sn$ alloy and an Ag—Au—Sn solid solution is formed from the semiconductor light emitting device body 21b side so that an n-type GaN layer 213a and a p-type GaN layer 213a are bonded to the wiring 2b of the substrate 2 and an electrical connection is carried out in accordance with the bonding mechanism. Consequently, a semiconductor light emitting apparatus is obtained.

THIRD EMBODIMENT

In the embodiment, a method of manufacturing a light emitting apparatus using the semiconductor light emitting device 31 of the vertical light emitting type shown in FIG. 3(a) will be described with reference to FIG. 7.

Figure 7A:
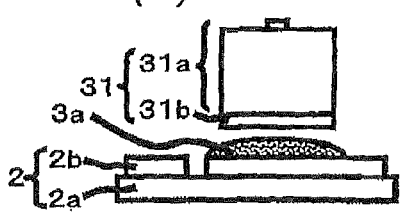
FIGS. 7(a) to 7(c) are sectional views showing a manufacturing method according to the third embodiment of the invention.
Figure 7B:
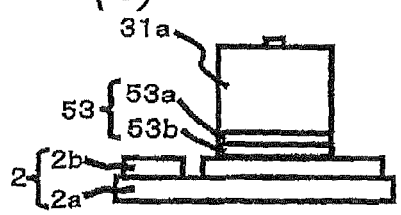
Figure 7C:
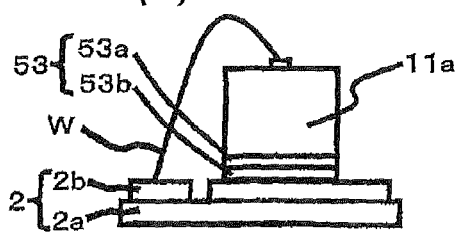

First of all, as shown in FIG. 7(a), the Ag paste 3a is applied onto a wiring 2b of a substrate 2 in which the wiring 2b is provided on a substrate body 2a, and an Au—Sn layer 31b side of the semiconductor light emitting device 31 is opposed to a region to which the Ag paste 3a is applied.

As shown in FIG. 6(b), next, a bonding layer 53 constituted by an AuSn alloy layer 53a and a mixed crystal layer 53b of an $Au_5Sn$ alloy and an Ag—Au—Sn solid solution is formed from a semiconductor light emitting device body 21b side so that the bonding layer 53 is bonded to the wiring 2b of the substrate 2 and an electrical connection to a p-type GaN layer 113a is carried out through a support substrate 315a in accordance with the bonding mechanism.

Finally, an n-type electrode 311e of a semiconductor light emitting device body 11b is connected through a wire W formed by a thin metallic wire such as Au so that an electrical connection of an n-type GaN layer 113a of the semiconductor light emitting device body 31b to the substrate 2 is carried out. Consequently, a semiconductor light emitting apparatus is obtained.

The method of manufacturing a semiconductor device and the semiconductor device according to the invention are applied to a surface light emitting type LED lamp (a so-called top view type LED lamp), a side light emitting type LED lamp (a so-called side view type LED lamp) or a chip on board type LED module (a so-called COB type module), and can be employed for various light sources such as lighting or a backlight of a liquid crystal display.

The invention is not restricted to the description of the embodiments according to the invention at all. The invention also includes various variants within the scope that the skilled in the art can easily reach without departing from the claims.

Although the description has been given by using the semiconductor light emitting device as the semiconductor element in the embodiments according to the invention, for example, the invention can be applied when other semiconductor elements such as semiconductor elements having at least one logical element (transistor element or diode element) formed thereon, semiconductor light receiving devices, semiconductor thyristor devices or their compound devices are to be mounted on a substrate.

What is claimed is:

1. A method of manufacturing a semiconductor device, comprising:
    mounting a semiconductor element having an Au—Sn layer on a substrate, the mounting of the semiconductor element including supplying an Ag paste having an Ag nanoparticle onto the substrate;
    mounting a side of the Au—Sn layer of the semiconductor element on the Ag paste;
    alloying the Au—Sn layer and the Ag paste to bond the semiconductor element to the substrate; and
    volatilizing a volatile solvent in the Ag paste after the supplying of the Ag paste,
    wherein during the volatilizing, increasing a temperature of the Ag paste to be in a range of 100° C. to 200° C., and
    wherein the Au—Sn layer has a content rate of Au of 50 at % to 85 at %.

2. The method of manufacturing the semiconductor device according to claim 1, wherein the volatile solvent includes an alcohol-based solvent.

3. The method of manufacturing a semiconductor device according to claim 2, wherein the alcohol based solvent includes diol.

4. The method of manufacturing the semiconductor device according to claim 1, further comprising:
    after the bonding, raising a temperature of the semiconductor device to be in a range of 280° C. to 330° C.

5. The method of manufacturing the semiconductor device according to claim 1, wherein the temperature of the Ag paste is increased such that an Ag nanoparticle aggregation layer is formed.

* * * * *